April 19, 1966 J. J. TIEMANN 3,247,396

ELECTRONIC CIRCUIT UTILIZING TUNNEL DIODE DEVICES

Filed March 31, 1960

Inventor:
Jerome J. Tiemann, by John F. Ahern
His Attorney.

United States Patent Office 3,247,396

Patented Apr. 19, 1966

3,247,396
ELECTRONIC CIRCUIT UTILIZING TUNNEL DIODE DEVICES

Jerome J. Tiemann, Burnt Hills, N.Y., assignor to General Electric Company, a corporation of New York Filed Mar. 31, 1960, Ser. No. 18,941
10 Claims. (Cl. 307—88.5)

This invention relates in general to electronic circuits and more particularly to non-attenuating delay lines and storage elements employing semiconductor devices.

It is an object of this invention to provide a new and improved non-attenuating delay line or storage element which combines circuit simplicity and economy of components.

It is another object of this invention to provide a non-attenuating delay line or storage element employing a plurality of narrow junction semiconductor diodes.

It is another object of this invention to provide a simplified circuit arrangement for producing a train of pulses of arbitrary spacing in response to a single initiating pulse.

It is still another object of this invention to provide a non-attenuating delay line or storage element which may be fabricated on a single body of semiconductive material and therefore allows for a high degree of miniaturization.

Briefly stated, in accordance with one aspect of this invention, a non-attenuating delay line or storage element comprises a plurality of narrow junction degenerate semiconductor diodes, bias means connecting the narrow junction diodes in parallel circuit relationship to provide two stable operating conditions therefor and coupling means between the narrow junction diodes. When the operating condition of one of the narrow junction diodes is changed this condition is transferred to the adjacent narrow junction diode a predetermined time thereafter.

Figure 1:
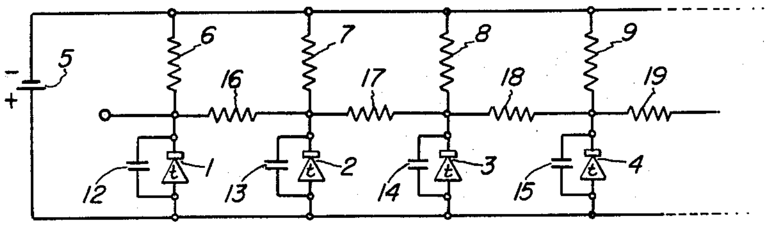
Figures 2, 5:
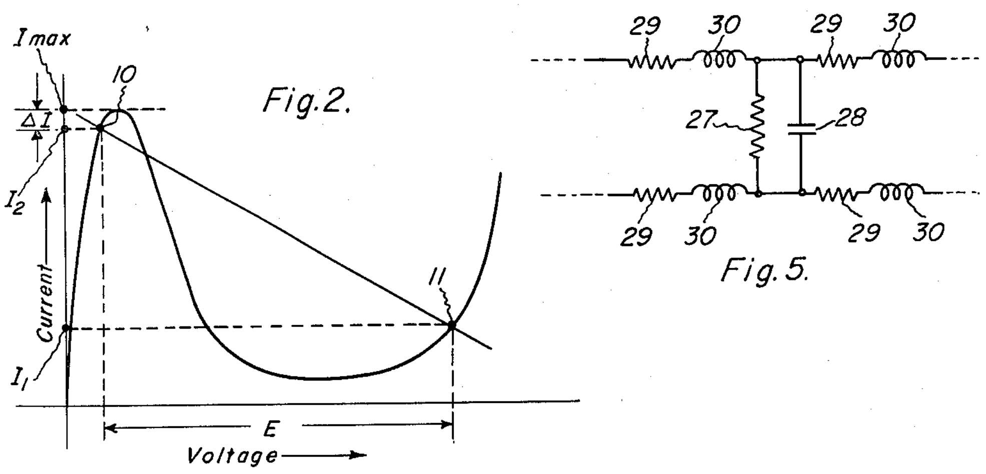
Figure 3:
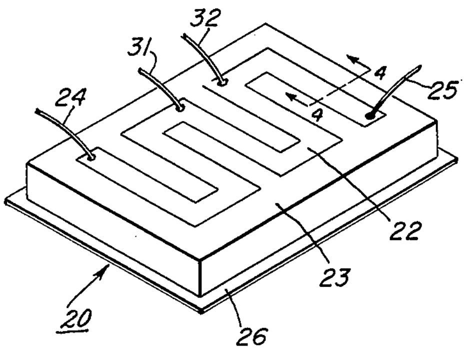
Figure 4:
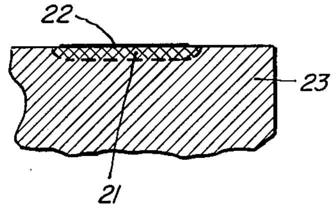

The features of my invention which I believe to be novel are set forth with particularity in the appended claims. My invention itself, however, both as to its organization and method of operation together with further objects and advantages thereof may best be understood by reference to the following description taken in conjunction with the accompanying drawing in which:

FIG. 1 is a schematic circuit diagram of a delay line in accord with one embodiment of this invention, FIG. 2 is a graphical presentation of a current-voltage characteristic of a typical narrow junction degenerate semiconductor device suitable for use in the practice of this invention together with a suitable direct current load line therefor, FIG. 3 is a perspective view of a semiconductive body in accordance with another embodiment of this invention, FIG. 4 is a section along the line 4—4 of the semiconductive body of FIG. 3 illustrating the junction region and, FIG. 5 is an equivalent circuit representative of the electrical properties of an elemental area of the semiconductive body of FIG. 3.

The semiconductor device used in the practice of this invention is a narrow junction degenerate semiconductor diode or so-called "tunnel diode." Such diodes are semiconductor devices including a single P-N junction and exhibiting a region of negative resistance in the low forward voltage range of their current-voltage characteristics.

Such devices are fabricated so as to provide regions of P and N-type conductivity having a very narrow junction therebetween, both of the regions being "degenerate." The use of the term "degenerate" refers to a body or region of semiconductive material which, if N-type, contains a sufficient concentration of excess donor impurity to raise the "Fermi-level" thereof to a value of energy higher than the minimum energy of the conduction band on the energy band diagram of the semiconductive material. In a P-type semiconductive body or region, degeneracy means that a sufficient concentration of excess acceptor impurities are present therein to depress the "Fermi-level" to an energy lower than the maximum energy of the valence band on the energy band diagram for the semiconductive material. The "Fermi-level" in such an energy band diagram is the energy level at which the probability of there being an electron present in any particular state is equal to one-half.

The forward voltage range of the current-voltage characteristic of such a device at which the negative resistance region appears varies depending upon the semiconductive material from which the device is fabricated. For example, the range of the negative resistance region for a germanium device is from about 0.04 to 0.3 volts while for gallium arsenide the range is from about 0.12 to 0.5 volt. It appears that the negative resistance of such a device is independent of frequency from zero cycles (direct current) to well into the microwave frequency region.

For further details concerning the narrow junction degenerate semiconductor device utilized in the practice of this invention, reference may be had to my copending application, Serial No. 858,995, filed December 11, 1959, which is assigned to the assignee of the present invention and incorporated herein by reference. The aforementioned application has been abandoned in favor of a continuation-in-part application, Serial No. 74,815, filed September 9, 1960, now Patent No. 3,197,839, which discloses and claims the subject matter of the parent application.

The non-attenuating delay line of FIG. 1 comprises a plurality of narrow junction degenerate semiconductor diodes 1–4 connected in parallel circuit relationship with a voltage source 5. Load lines are established for each of the diodes 1–4 such that there are two stable operating conditions therefor. This may be by means of an appropriate impedance such as resistances 6–9 connected in series with each of the diodes 1–4 respectively. The value of the resistances 6–9 in series with each of the diodes 1–4 affects the slope of the direct current load line, and the intersection of the load line with the diode current-voltage characteristic determines the operating point for each diode. Since the current-voltage characteristic of the narrow junction diode utilized herein exhibits a region of negative resistance between two regions of positive resistance, a load line which intersects the characteristic in both positive resistance regions provides two stable points of operation. Voltage source 5 and resistances 6–9 are selected, therefore, to establish a load line such as shown at A in FIG. 2 intersecting the diode characteristic B at the two stable operating regions 10 and 11. Capacitances 12–15 represent the junction capacitance of diodes 1–4 respectively. This capacitance effectively shunts the diode as shown and is always present in the diode itself. Although the value of this capacitance depends upon the techniques employed in its fabrication, presently this capacitance usually varies in the range of 1500 mmf. to less than 2 mmf.

Coupling means are provided between each of the diodes such as, for example, resistances 16–19. Alternatively, components 16–19 may be a plurality of inductances. The above are all the components required in this new and improved delay line. While the delay line in FIG. 1 shows only four diodes it is readily apparent that any number of such diodes may be employed and the delay line made as long as desired. When such a delay line is made sufficiently long it may be utilized effectively as a storage element.

The operation of the circuit of FIG. 1 may best be described with reference to the current-voltage characteristic shown in FIG. 2 which illustrates the direct current load line A intersecting the diode current-voltage characteristic B to provide the two stable operating points 10 and 11.

Diodes 1–4 are connected as shown in FIG. 1 and resistances 6–9 and 16–19 are selected to establish load lines therefor, which provide two stable operating points for each diode. Assume initially that all diodes are in the stable operating condition shown by point 10 of FIG. 2. When a pulse is impressed on diode 1, for example, such that the voltage corresponding to the peak current thereof is exceeded, the diode almost instantaneously switches to its other stable operating point shown at 11. The voltage increase across diode 1 produces a current in coupling impedance 16 and causes capacitance 13 of diode 2 to charge to this increased voltage. This results in the voltage across diode 2 reaching a value in excess of that corresponding to the peak current thereof causing diode 2 to switch to its other stable operating condition 11. This change in condition of diode 1, therefore, proceeds to the adjacent diode causing it to switch at a slightly later time depending upon the characteristic time or time constant of the coupling means. For example, where the coupling means is a resistance the characteristic time is the resistance-capacitance time constant of this coupling resistance and the junction capacitance of the diode. Alternatively, where the coupling means is an inductance the characteristic time is determined by the relationship:

$$\Delta t = L\Delta I/E$$

where:

$E$=voltage swing as shown in FIG. 2.
$\Delta I=(I_{max}-I_2)$ as indicated in FIG. 2.
$L$=inductance The pulse originally impressed on diode 1 appears at the output end of the line a predetermined time after the initiating pulse and without attenuation. The output of all the diodes may be connected to a common load to provide a train of pulses of arbitrary spacing in time in response to a single initiating pulse.

Another embodiment of the present invention is illustrated in FIGS. 3 and 4. A semiconductor device generally designated at 20, has a junction 21 in the form of a narrow strip therein which is long with respect to its width. It is desirable that the junction be as long as possible but that the over-all device dimension be small. Therefore, a suitable junction may be formed in a zigzag or similar configuration to achieve this result. On one side of junction 21 there is a region or body 22 of degenerate semiconductive material of one-conductivity type and on the other side of junction 21 there is a region or body 23 of degenerate semiconductive material of opposite-conductivity type. The region 22 may be of N-type conductivity, for example, and the region 23 of P-type conductivity.

The methods of forming such P-N junctions are well-known in the art and may be, for example, by alloying, to a degenerate semiconductive body of one conductivity, an impurity material capable of imparting to that body opposite-conductivity type when a recrystallized region is formed therein such that the recrystallized region is degenerate semiconductive material of opposite-conductivity type.

Semiconductor device 20 has an electrode 24 contacting one end of region 22 and another electrode 25 contacting the other end thereof. A third electrode makes contact with the entire area of semiconductive material 23. This may conveniently be in the form of a metal plate as shown at 26 and may be connected to ground potential in operation. Either of the electrodes 24 and 25 may be utilized as input or output as desired since the device so formed is bi-lateral and translates a signal in either direction in the same manner. Region 22 has resistance and inductance per unit length which depends inversely upon its cross-sectional area. Depending upon the time delay desired, therefore, the cross section of region 22 is dimensioned accordingly. This may be conveniently provided, for example, by making the region 22 extremely narrow to produce longer delay times and making region 22 less narrow for shorter delay times. Thus, a device so formed is the equivalent of a plurality of narrow junction degenerate semiconductor diodes in parallel relationship with each other, coupled together by the resistance and inductance of the semiconductive material which separates respective elemental areas.

The electrical properties of an elemental area of a semiconductor device such as that of FIG. 3 may be represented by an equivalent circuit as shown in FIG. 5. The parallel combination of negative resistance 27 and capacitance 28 represents the characteristics of the junction. Resistance 27 represents the negative resistance of the narrow junction diode present in an elemental area of the device and capacitance 28 the junction capacitance shunted across the junction. Resistances 29 and inductances 30 represent resistance and inductance respectively between different elemental areas and collectively possess a characteristic time constant. Due to these time constants there is a finite delay in the propagation of an input signal from one elemental area to the next and consequently from one end of the body to the other.

In FIG. 3, for example, when a pulse is impressed on one end of the device 20, such as at terminal 24, it appears at output terminal 25 a finite time later depending upon the velocity of propagation between the different elemental areas within the particular device and the distance between input and output terminals. Each elemental area is caused to switch at a time determined by the characteristic time constant of the resistance, inductance and capacitance present between each elemental area. The device thus operates in the same manner as the circuit configuration shown in FIG. 1 and provides an electronic circuit which may be utilized as a non-attentuating delay line, storage element or pulse generator, for example, which is fabricated upon a single body of semiconductive material. If a train of pulses is desired, outputs may be taken at different locations along the device 20 such as at additional electrodes 31 and 32 and connected to a common load. The initial pulse then produces a reproducible train of pulses having arbitrary spacing in time. FIG. 3 shows only an illustrative example of a semiconductor device in accordance with this invention and it is to be appreciated that such a device may be made as long as desired and include a plurality of electrodes along the length thereof.

It is readily apparent that such a delay line or pulse generator is striking in its simplicity and saving in circuit components when compared with any other known arrangement. As is true for the embodiment of FIG. 1 this embodiment may be also readily utilized as a storage element. By the great reduction in components which is possible a very high degree of miniaturization is readily provided in addition to significant cost reduction. These advantages are particularly significant for applications in complex electronic systems where component cost and circuit complexity are major considerations.

While only certain preferred features of the invention have been shown by way of illustration, many modifications and changes will occur to those skilled in the art. It is, therefore, to be understood that the appended claims are intended to cover all such modifications and changes as fall within the true spirit and scope of the invention.

What I claim as new and desire to secure by Letters Patent of the United States is:

1. An electronic circuit comprising: a plurality of narrow junction degenerate semi-conductor diodes each exhibiting a current peak and a negative resistance region in the low forward voltage range of its current-voltage characteristic; bias means in circuit with each of said diodes providing two stable conditions of operation therefor; linear conducting means coupling each of said diodes in parallel circuit relationship to provide that a change in the operating condition of one of said diodes in response to a single input signal is translated to the adjacent diode a predetermined time thereafter.

2. The circuit of claim 1 wherein the means for coupling said diodes in parallel circuit relationship is a resistance and the time delay is determined by the time constant of the combination of said resistance and the junction capacitance of said diode.

3. The circuit of claim 1 wherein the means for coupling said diodes in parallel circuit relationship is an inductance and the time delay is determined by the time constant of the combination of said inductance and the junction capacitance of said diode.

4. An electronic circuit comprising: a plurality of narrow junction degenerate semiconductor diodes each exhibiting a current peak and a negative resistance region in the low forward voltage range of the its current-voltage characteristic; bias means in circuit with each of said diodes providing two stable operating conditions therefor; linear conducting means coupling each of said diodes together in parallel circuit relationship; means for impressing an input signal to one of said diodes to cause it to shift from one stable operating condition to the other; and means connecting each of said diodes to a common load to provide a predetermined train of pulses therein arbitrarily spaced in time in response to said input signal.

5. The electronic circuit of claim 4 wherein the linear conducting means coupling said diodes in parallel circuit relationship is an inductance.

6. The electronic circuit of claim 4 wherein the linear conducting means coupling said diodes in parallel circuit relatonship is an inductance.

7. An electronic circuit comprising: a plurality of narrow junction degenerate semiconductor diodes each having two electrodes and a predetermined junction capacitance effectively in parallel with said electrodes, said diodes exhibiting a current-voltage characteristic having a current peak and a negative resistance region; a plurality of resistances; means connecting one of said resistances in series with each of said diodes; a voltage source; means connecting each of said series connected diode and resistance combinations in parallel circuit relationship with said voltage source to provide each of said diodes with an appropriate bias to establish two stable conditions of operation therefor; and linear conducting means connected between the juncture of said diode and said resistance to couple said diodes in parallel circuit relationship to provide that a change in operating condition of one of said diodes is translated to the adjacent diode a predetermined time thereafter.

8. The circuit of claim 7 wherein the linear conducting means is a resistance.

9. The circuit of claim 7 wherein the linear conducting means is an inductance.

10. An electronic circuit comprising: a semiconductive body having a degenerate p-type region and a degenerate n-type region defining a narrow p-n junction region in said body, said p-n junction region being in the form of a narrow strip that is very long with respect to its width; a plurality of electrodes connected to one of said degenerate regions and spaced along the length of said p-n junction region providing a corresponding plurality of elemental narrow junction degenerate semiconductor diodes each exhibiting a current peak and a negative resistance region in the low forward voltage range of its current-voltage characteristic; and, means for biasing each of said diodes providing two stable conditions of operation therefor, so that a change in the operating condition of one of said elemental diodes in response to a single input signal to one of said electrodes is translated to an adjacent elemental diode a predetermined time thereafter.

References Cited by the Examiner

UNITED STATES PATENTS

| | | | |
|---|---|---|---|
| 2,585,571 | 2/1952 | Mohr | 307—88.5 |
| 2,614,141 | 10/1952 | Edson et al. | 307—88.5 |
| 2,832,898 | 4/1958 | Camp | 307—88.5 |
| 2,877,358 | 3/1959 | Ross | 307—88.5 |
| 2,944,164 | 7/1960 | Odell et al. | 307—88.5 |
| 2,958,046 | 10/1960 | Watters | 307—88.5 |
| 2,983,854 | 5/1961 | Pearson | 307—88.5 |
| 2,997,604 | 8/1961 | Shockley | 307—88.5 |
| 3,033,714 | 5/1962 | Ezaki et al. | 317—235 |
| 3,053,998 | 9/1962 | Chynoweth et al. | 307—88.5 X |

JOHN W. HUCKERT, *Primary Examiner.*

HERMAN KARL SAALBACH, *Examiner.*